(12) United States Patent
Henson et al.

(10) Patent No.: US 8,577,316 B2
(45) Date of Patent: Nov. 5, 2013

(54) MECHANICALLY TUNED RADIO UTILIZING RATIOMETRIC TIME MEASUREMENTS AND RELATED METHODS

(75) Inventors: Matthew B. Henson, Austin, TX (US); Greg Allan Hodgson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 909 days.

(21) Appl. No.: 12/586,968

(22) Filed: Sep. 30, 2009

(65) Prior Publication Data

US 2011/0076973 A1    Mar. 31, 2011

(51) Int. Cl.
*H04B 1/18*    (2006.01)

(52) U.S. Cl.
USPC ............ 455/179.1; 455/165.1; 324/676; 324/677; 324/678; 324/705; 324/711; 324/723; 345/161

(58) Field of Classification Search
USPC ............ 455/157.2, 165.1, 193.1, 179.1; 324/676, 723, 677, 678, 705, 711; 345/161
See application file for complete search history.

(56) References Cited

U.S. PATENT DOCUMENTS

| | | | |
|---|---|---|---|
| 3,667,302 A | 6/1972 | Olah | 74/10.37 |
| 4,008,436 A | 2/1977 | Fujita | 325/335 |
| 4,267,601 A * | 5/1981 | Umeda et al. | 455/165.1 |
| 4,320,255 A | 3/1982 | Null et al. | 179/1 G |
| 4,389,732 A | 6/1983 | Sasahara et al. | 455/160 |
| 4,392,254 A | 7/1983 | Ecklund | 455/173 |
| 4,841,458 A * | 6/1989 | Levine et al. | 702/133 |
| 4,987,372 A * | 1/1991 | Ofori-Tenkorang et al. | 324/705 |
| 5,467,266 A * | 11/1995 | Jacobs et al. | 700/56 |
| 5,563,519 A | 10/1996 | Honkanen | 324/676 |
| 6,577,297 B1 * | 6/2003 | Wright | 345/161 |
| 6,737,877 B1 | 5/2004 | Hatton et al. | 324/723 |
| 6,809,531 B2 | 10/2004 | Slye et al. | 324/714 |
| 6,999,063 B1 * | 2/2006 | Wright | 345/161 |
| 7,586,314 B2 | 9/2009 | Goeke | 324/609 |
| 7,755,547 B2 | 7/2010 | Rahola et al. | 343/702 |

* cited by examiner

*Primary Examiner* — Junpeng Chen
(74) *Attorney, Agent, or Firm* — Egan, Peterman & Enders LLP.

(57) ABSTRACT

Mechanically tuned radios and related methods are disclosed that utilize ratiometric time measurements to detect settings for mechanical adjustment mechanisms. The radio systems and methods disclosed make a first time measurement associated with a mechanically adjusted circuit, make a second time measurement associated with the mechanically adjusted circuit, determine a setting for the mechanical adjustment mechanism based upon a ratio associated with the first and second time measurements, and utilize the setting to select a tuning frequency for signals received by the radio. More generally, ratiometric time measurements can be used to determine a setting for a mechanical adjustment mechanism for a mechanically adjusted circuit, and this setting can be used to at least part control a desired operational feature of a device.

31 Claims, 6 Drawing Sheets

MECHANICALLY TUNED RADIO UTILIZING RATIOMETRIC TIME MEASUREMENTS AND RELATED METHODS

TECHNICAL FIELD OF THE INVENTION

This invention relates to radio frequency communications and, more particularly, to mechanically tuned radios.

BACKGROUND

Portable devices exist that utilize mechanical tuning for radio frequency (RF) receivers, such as mechanically tuned radios for tuning and receiving AM and FM terrestrial audio broadcast channels. Many prior mechanically tuned radios utilize mechanical tuning wheels where one or more local oscillators and/or an analog filter are directly adjusted by the mechanical tuning mechanism. This tuning wheel, therefore, is directly used to select a tuning frequency for the mechanically tuned radio.

Another type of mechanically tuned radio that has been considered is one in which an analog value associated with a mechanical tuning mechanism is digitized and then used to select a tuning frequency for the mechanically tuned radio. Such a digitally-controlled mechanically-tuned radio is described in U.S. patent application Ser. No. 12/231,184, entitled "MECHANICAL TUNING OF A RADIO," and filed Aug. 29, 2008, which is hereby incorporated by reference in its entirety. As described therein, detection of the setting for the mechanical tuning mechanism is achieved by receiving an analog signal from the mechanical tuning mechanism and then digitizing this analog signal within a receiver integrated circuit. The resulting digital value is then used to select the tuning frequency for the radio. As such, the mechanical tuning mechanism indirectly selects the tuning frequency for the radio.

While this use of an analog-to-digital converter within a receiver integrated circuit is a viable solution, it is also desirable to detect a setting for a mechanical tuning mechanism without utilizing such an analog-to-digital converter.

Some prior devices have used input pins for an integrated circuit to detect rise time associated with multiple selectable resistors in combination with a capacitor. For example, a user can select a button from 3 to 4 buttons that are each associated with a different resistor value. The selected resistor value becomes part of a completed circuit with the capacitor. Further, the resistor values are typically selected to have a non-linear, geometric relationship. In operation, a voltage rise time associated with this circuit is used to determine which button the user has selected. Unfortunately, this technique typically provides about 2-3 bits of precision. This level of precision is far below the 8-bits of precision needed for a mechanically tuned radio solution.

SUMMARY OF THE INVENTION

Mechanically tuned radios utilizing ratiometric time measurements and related methods are described that do not require the use of analog to digital converters for detection of settings for mechanical adjustment mechanisms. The radio systems and methods disclosed make a first time measurement associated with a mechanically adjusted circuit, make a second time measurement associated with the mechanically adjusted circuit, determine a setting for the mechanical adjustment mechanism based upon a ratio associated with the first and second time measurements, and utilize the setting to select a tuning frequency for signals received by the radio.

More generally, ratiometric time measurements can be used to determine a setting for a mechanical adjustment mechanism for a mechanically adjusted circuit, and this setting can be used to at least part control a desired operational feature of a device. Other features and variations could also be implemented, as desired, and related systems and methods can be utilized, as well.

DESCRIPTION OF THE DRAWINGS

It is noted that the appended drawings illustrate only example embodiments of the invention and are, therefore, not to be considered limiting of its scope, for the invention may admit to other equally effective embodiments.

DETAILED DESCRIPTION OF THE INVENTION

Mechanically tuned radios utilizing ratiometric time measurements and related methods are described that do not require the use of an analog to digital converter for detection of mechanical tuning settings. The radio systems and methods disclosed make a first time measurement associated with a mechanically adjusted circuit, make a second time measurement associated with the mechanically adjusted circuit, determine a setting for the mechanically adjusted circuit based upon a ratio associated with the first and second time measurements, and utilize the setting to select a tuning frequency for signals received by the radio.

While the discussions below focus on utilizing a mechanically adjusted circuit for selecting a tuning frequency for a radio, a mechanically adjusted circuit can also be used for other purposes within a device. As such, a device can detect a setting for a mechanical adjustment mechanism for a mechanically adjusted circuit using the ratiometric time measurements described herein and use this setting for controlling, at least in part, any desired operational feature of the device. Using this detected setting for tuning of a radio is just one implementation for taking advantage of the ratiometric time measurements described herein for detecting a setting of a mechanically adjusted circuit. Other features and variations could also be implemented, as desired, and related systems and methods can be utilized, as well.

Figure 1A:
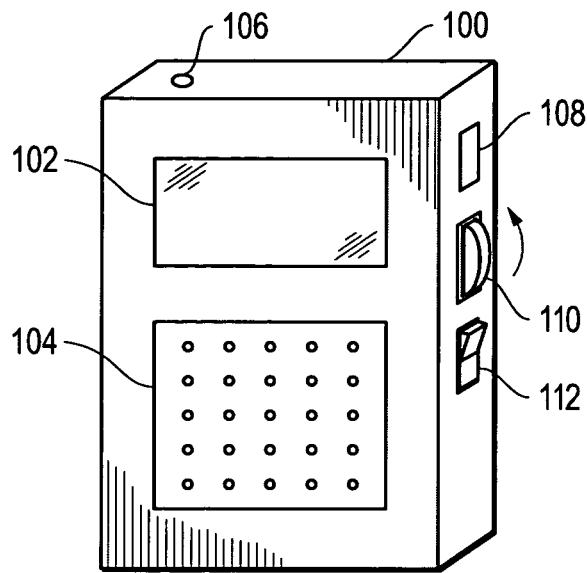
FIG. 1A is a diagram for a mechanically tuned radio as described herein.

FIG. 1A is a diagram for a mechanically tuned radio 100 as further described herein. In the embodiment depicted, the radio 100 includes a display 102, a speaker 104, a port 106 for earphones, an on/off switch 108, a band select switch 112 and a tuning dial 110. It is noted that additional functional features could also be provided, if desired, and fewer functional features could also be provide, if desired. In addition, rather then a tuning dial 110, the radio 100 could have a different mechanism for providing mechanical adjustment.

Figure 1B:
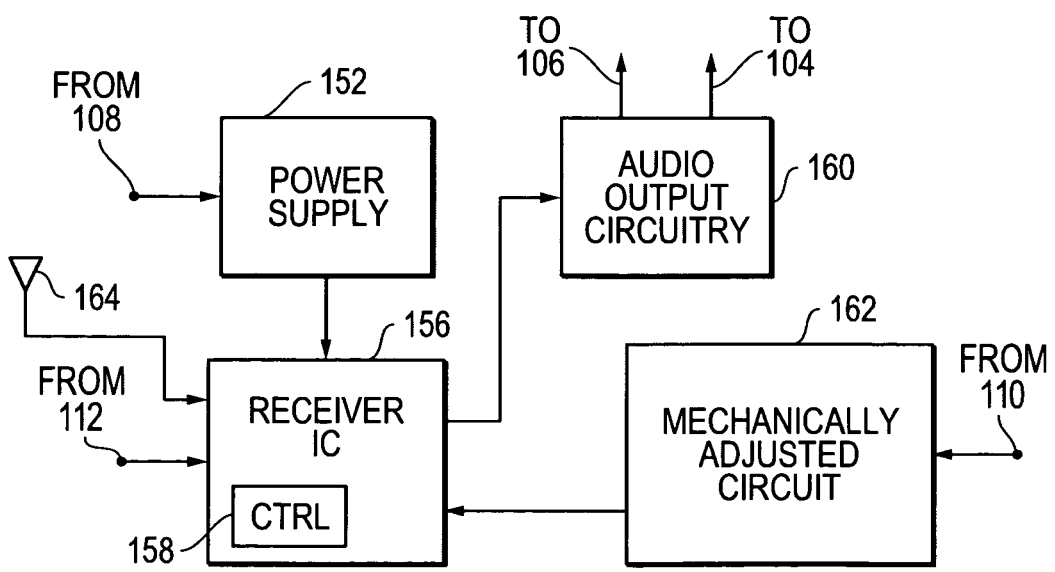
FIG. 1B is a block diagram for example circuitry within the radio.

FIG. 1B is a block diagram for example circuitry within the mechanically tuned radio 100. In the embodiment depicted, the mechanically tuned radio 100 includes an antenna 164 (e.g., internal antenna or external antenna), a power supply 152, a receiver integrated circuit (IC) 156, audio output circuitry 160, and a mechanically adjusted circuit 162. The power supply circuitry 152 can be configured to receive an on/off signal from the on/off switch 108. The receiver IC 156 can be configured to include control circuitry 158, which can be implemented using a microcontroller or other desired circuitry to control the operation of the receiver IC 156. The receiver IC 156 can also be configured to receive an input from the antenna 164, can be configured to receive a band selection signal from the band selection switch 112 (e.g., selecting between an AM broadcast band and an FM broadcast band), and can also be configured to receive other inputs, if desired. The receiver IC 156 also receives signals from the mechanically adjusted circuit 162, which in turn is configured to be mechanically adjusted through a mechanical adjustment mechanism, such as through tuning dial 110. For example, as the user adjusts the tuning dial 110, the mechanically adjusted circuit 162 is also changed. In the further embodiments described below, this mechanically adjusted circuit 162 is a variable resistor or a variable impedance, but could be implemented with other circuitry if desired.

For the mechanical adjustments made by the user to be used by the radio 100 to at least in part control the tuning of the radio, the settings for these relative adjustments made to the mechanically adjusted circuit 162 are detected by the radio circuitry. The detection methods and systems described herein rely upon ratiometric timing measurements associated with the mechanically adjusted circuit 162 to determine the settings made by the user to the adjusted circuit 162 through the tuning dial 110. As described below, the receiver IC 156 makes multiple ratiometric timing measurements, determines the setting of the mechanical tuning circuit 162 based upon those ratiometric timing measurements, and uses the setting to determine the tuning frequency for the radio. As such, radio broadcast channels received by the antenna 164 can be tuned by the receiver IC 156 and output as audio signals to the audio output circuitry 160 based upon mechanical user adjustments made to the tuning dial 110 and thereby to the mechanically adjusted circuit 162.

Figure 2A:
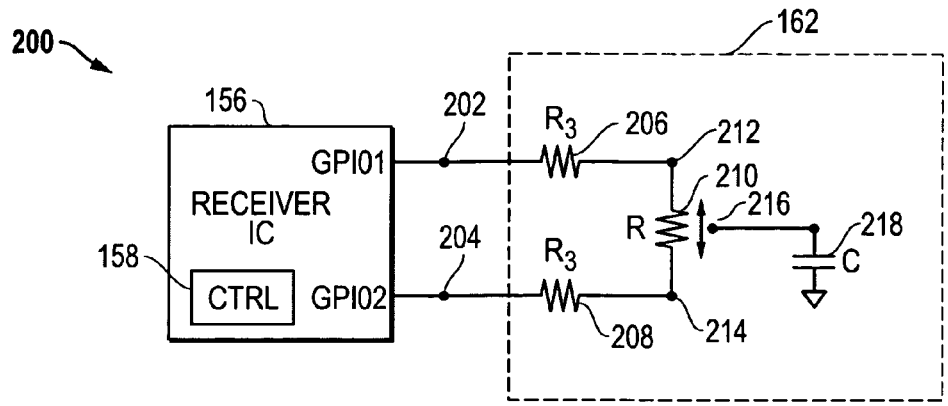
FIG. 2A is a diagram for a mechanical tuning circuit coupled to input pins for a receiver integrated circuit (IC).

FIG. 2A is a diagram for an embodiment 200 with a mechanically adjusted circuit 162 coupled to input pins for a receiver integrated circuit (IC) 156. As depicted, the mechanically adjusted circuit 162 includes a variable resistor (R) 210 having a first terminal 212, a second terminal 214, and a variable tap node 216. The variable tap node 216 is also connected to ground through a capacitor (C) 218. The first terminal 212 is connected to a first pin (GPIO1) 202 of the receiver IC 156 through a resistor (R3), and the second terminal 214 is connected to a second pin (GPIO2) 204 of the receiver IC 156 through a resistor (R3). Preferably, the pins utilized for these connections are general programmable input/output (GPIO) pins so that there function can be adjusted, as described below. It is noted that the two connection resistors (R3) can be 200 ohms. It is also noted that the tap node 216 is configured to be controlled by the mechanical adjustment mechanism, such as the tuning dial 110.

Figure 2B:
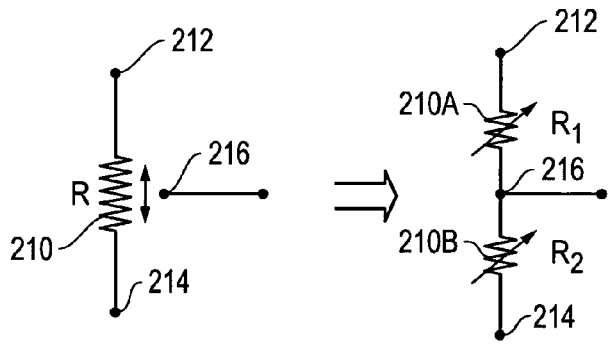
FIG. 2B is a circuit diagram for the variable resistor and an equivalent circuit.

FIG. 2B is a circuit diagram for the variable resistor and an equivalent circuit. The variable resistor 210 can be represented as two variable resistors. The first variable resistor (R1) 210A represents the portion of the variable resistor 210 that is between the first terminal 212 and the variable tap node 216. The second variable resistor (R2) 210B represents the portion of the variable resistor 210 that is between the second terminal 214 and the variable tap node 216.

Figure 2C:
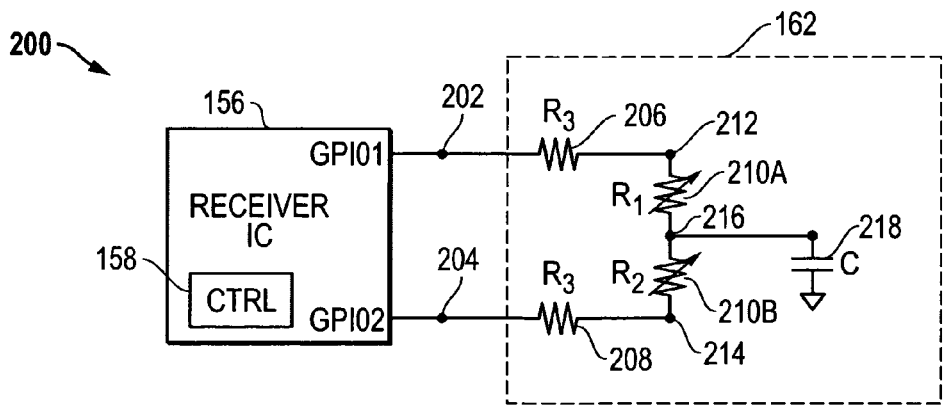
FIG. 2C is a diagram for the mechanical tuning circuit, as represented by two variable resistors, coupled to input pins for a receiver integrated circuit (IC).

FIG. 2C is a diagram for the mechanical tuning circuit 162, as represented by two variable resistors (R1, R2), coupled to input pins for the receiver IC 156. FIG. 2C is identical to FIG. 2A except that the variable resistor 210 is now represented as a first variable resistor (R1) 210A and a second variable resistor (R2) 210B.

The receiver IC 156 can be configured through the control circuitry 158 to periodically detect the setting of the mechanically adjusted circuit 162. To make this determination, as described herein, the receiver IC 156 makes ratiometric time measurements. For example, the receiver IC 156 can be configured to make a first time measurement ($T_1$) associated with the first variable resistor (R1) 210A and to make a second time measurement ($T_2$) associated with the second variable resistor (R2) 210B. In particular, these time measurements can be associated with an amount of time it takes a voltage node to rise to a threshold value, as described below. The receiver IC 156 can then be configured to use a ratio associated with these time measurements to determine a setting for the mechanical adjustment mechanism 110. As such, the receiver IC 156 uses ratiometric time measurements to determine the setting for the mechanically adjusted circuit 162.

Figure 3A:
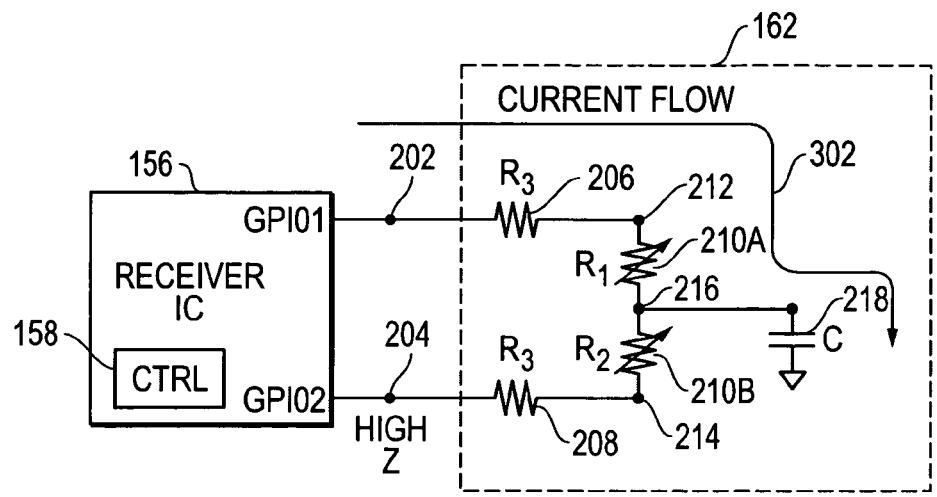
FIG. 3A is a diagram for current flow for a first time measurement.

FIG. 3A is a diagram for current flow associated with a first time measurement associated with the first variable resistor (R1) 210A. When this detection event is triggered, the receiver IC 156 first sets the first pin (GPIO1) 202 to a high voltage level ($V_{GPIO1}$), such as the power supply voltage level (Vdd) for the receiver IC 156. The receiver IC 156 also sets the second pin (GPIO2) 204 to a high impedance (Z) state. When this is done, a current begins flowing as shown be current flow line 302. This current flow 302 causes the voltage on the tap node 216, which is connected to the capacitor (C) 218, to rise from ground and asymptotically approach the voltage ($V_{GPIO1}$) placed on the first pin (GPIO1) 202.

Figure 3B:
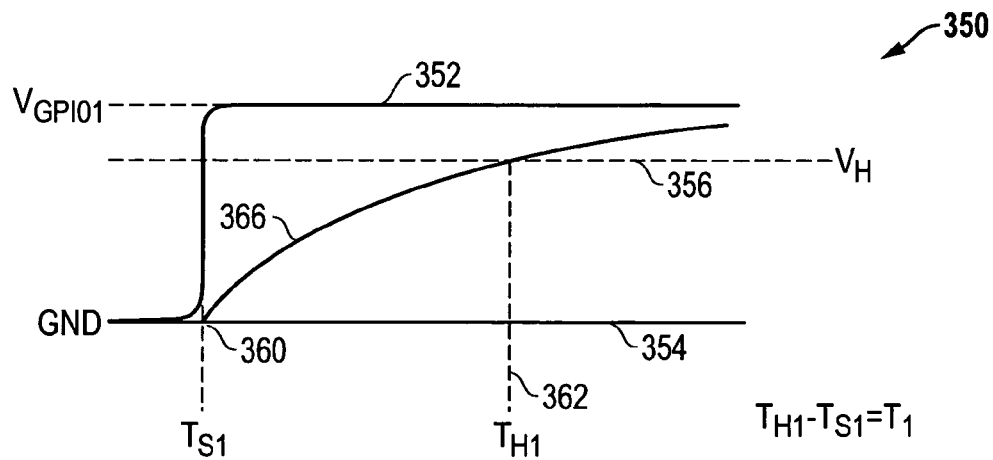
FIG. 3B is a signal diagram showing the detection of a signal rise time associated with the configuration shown in FIG. 3A.

FIG. 3B is a signal diagram 350 showing the detection of a signal rise time ($T_1$) associated with the configuration shown in FIG. 3A. As stated above, the voltage on the tap node 216 will rise from ground 354 and asymptotically approach the voltage level ($V_{GPIO1}$) 352 placed on the first pin (GPIO1) 202. The rise of this voltage, as represented by line 366, will be dependent upon the value of the capacitor (C) 218 and the first variable resistor (R1) 210A. Because the second pin (GPIO2) 204 is set to a high impedance (Z) state, this voltage rise 366 will also be present at the second pin (GPIO2) 204. The receiver IC 156 then detects an end time ($T_{H1}$) 362 at which the voltage rise 366 passes a threshold voltage ($V_H$) 356. The receiver IC 156 then compares this end time ($T_{H1}$) 362 to the start time ($T_{S1}$) 360 when the voltage on the first pin (GPIO1) 202 was set to the high voltage level ($V_{GPIO1}$) 352. The comparison provides a first rise time ($T_1 = T_{H1} - T_{S1}$) that is related to the value of the first variable resistor ($R_1$) 210A.

It is noted that the receiver IC 156 can be configured to use a Schmidt trigger circuit to detect when the voltage rises through the threshold voltage ($V_H$) 356. The Schmidt trigger circuit can be biased to switch states when the voltage rises above the threshold voltage ($V_H$) 356. This change in states can be used by the receiver IC 156 to determine the first end time ($T_{H1}$) 362. It is further noted that the threshold voltage ($V_H$) 356 can be selected, if desired, to be about 65% of the high output voltage level, which is also the voltage ($V_{GPIO1}$) placed on the first pin (GPIO1) 202.

Further, it is noted that the first signal rise time ($T_1$) can be measured with a counter internal to the control circuitry (CTRL) 158 with a resolution greater than the desired measurement resolution. The timer, for example, can be started at the measurement start time ($T_{S1}$) 360 and stopped at the measurement stop time ($T_{H1}$) 362. If for example the desired measurement resolution is 8 bits, the counter would be configured to have 9 or more effective bits of resolution, and the counter time-base would be selected such that the maximum count time is greater than the expected time ($T_1$) but not so long as to reduce the effective resolution of the measurement. It is noted that the maximum time for $T_1$ is based on values selected for (R1) 210A, (R2) 210B, (R3) 206, (R3) 208 and (C) 218.

Once the receiver IC 156 has determined the first rise time ($T_1$) associated with the first variable resistor ($R_1$) 210A, the receiver IC 156 then determines a second rise time ($T_2$) associated with the second variable resistor ($R_2$) 210B.

Figure 4A:
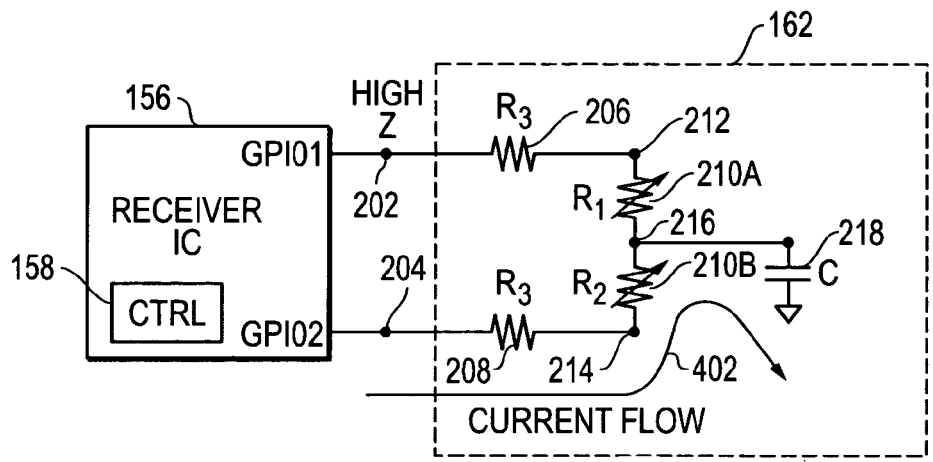
FIG. 4A is a diagram for current flow for a second time measurement.

FIG. 4A is a diagram for current flow associated with a second time measurement associated with the second variable resistor (R2) 210B. When this second detection event is triggered, the receiver IC 156 first sets the second pin (GPIO2) 204 to a high voltage level ($V_{GPIO2}$), such as the power supply voltage level (Vdd) for the receiver IC 156. The receive 156 also sets the first pin (GPIO1) 202 to a high impedance (Z) state. When this is done, a current begins flowing as shown be current flow line 402. This current flow 402 causes the voltage on the tap node 216, which is connected to the capacitor (C) 218, to rise from ground and asymptotically approach the voltage ($V_{GPIO2}$) placed on the second pin (GPIO2) 204.

Figure 4B:
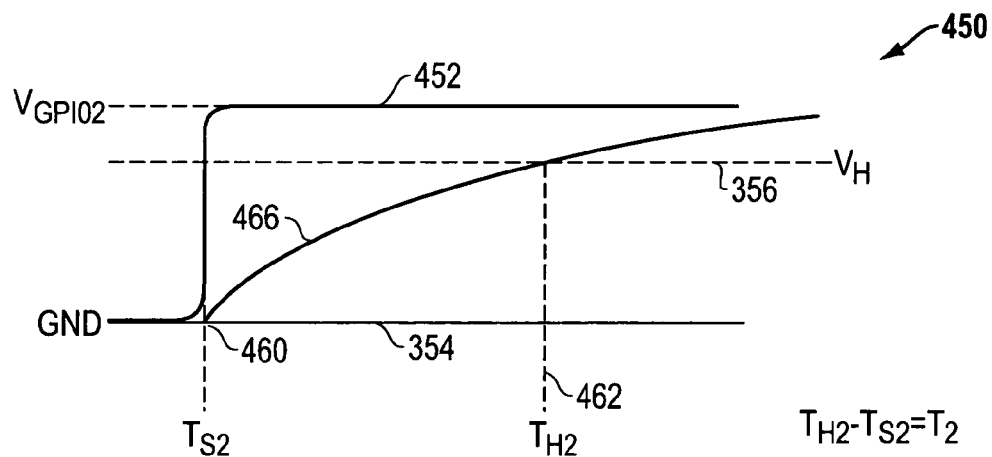
FIG. 4B is a signal diagram showing the detection of a signal rise time associated with the configuration shown in FIG. 4A.

FIG. 4B is a signal diagram 450 showing the detection of a signal rise time ($T_2$) associated with the configuration shown in FIG. 4A. As stated above, the voltage on the tap node 216 will rise from ground 354 and asymptotically approach the voltage level ($V_{GPIO2}$) 452 placed on the second pin (GPIO2) 204. The rise of this voltage, as represented by line 466, will be dependent upon the value of the capacitor (C) 218 and the second variable resistor (R2) 210B. Because the first pin (GPIO1) 202 is set to a high impedance (Z) state, this voltage rise 466 will also be present at the first pin (GPIO1) 202. The receiver IC 156 then detects an end time ($T_{H2}$) 462 at which the voltage rise 366 passes a threshold voltage ($V_H$) 356. The receiver IC 156 then compares this end time ($T_{H2}$) 462 to the start time ($T_{S2}$) 460 when the voltage on the second pin (GPIO2) 204 was set to the high voltage level ($V_{GPIO2}$) 452. The comparison provides a second rise time ($T_2 = T_{H2} - T_{S2}$) that is related to the value of the second variable resistor ($R_2$) 210B.

It is noted that the second signal rise time $T_2$ can also be measured using the process described above with respect to the measurement of the first signal rise time $T_1$. It is also noted that the counter time-base is configured to be constant when measuring T1 and T2; however, the counter time-base may be changed as desired before measuring the next T1/T2 pair so long as the counter resolution is maintained such that the resolution is greater than the desired measurement resolution.

Further, as above, it is again noted that the receiver IC 156 can be configured to use a Schmidt trigger circuit to detect when the voltage rises through the threshold voltage ($V_H$) 356. The Schmidt trigger circuit can again be biased to switch states when the voltage rises above the threshold voltage ($V_H$) 356. This change in states can be used by the receiver IC 156 to determine the second end time ($T_{H2}$) 462. It is again further noted that the threshold voltage ($V_H$) 356 can be selected to be about 65% of the voltage ($V_{GPIO2}$) placed on the second pin (GPIO2) 204, if desired.

Figure 5A:
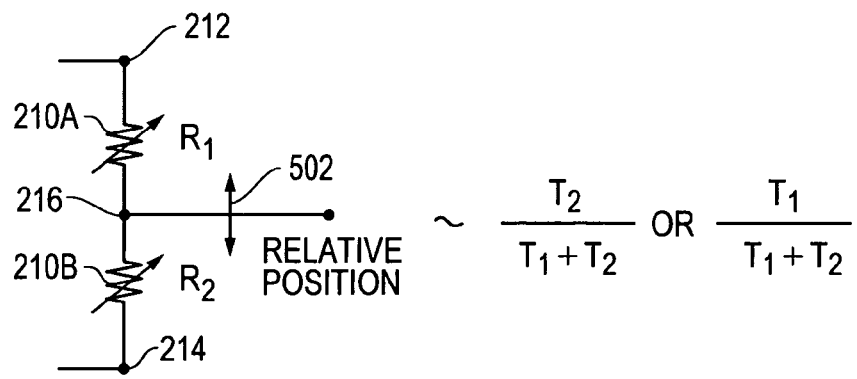
FIG. 5A is a circuit diagram showing that a setting for the variable resistor correlates to a ratio associated with the time measurements.

FIG. 5A is a circuit diagram showing that the variable resistor position setting correlates to the relationship of the time measurements. The position of the tap node 216 with respect to the variable resistor 210 will be related to a ratio of the timing measurements. As the tap node 216 is moved up and down as indicated by 502, the resistances associated with the first variable resistor ($R_1$) and the second variable resistor ($R_2$) will also change. The first rise time ($T_1$) is proportional to the size of the first variable resistor ($R_1$), and the second rise time ($T_2$) is proportional to the size of the second variable resistor ($R_2$). The relative position of the tap node, therefore, will be proportional to the rise times. In particular, the relative position can be represented by the proportion of $T_2$ to the total time of $T_1$ plus $T_2$, and relative position can be also be represented by the proportion of $T_1$ to the total time of $T_1$ plus $T_2$. As such, both of the following equations can be used by the receiver IC 156 to determine the relative position:

$$\frac{T2}{T1+T2} \sim \text{relative position of tap node}$$

$$\frac{T1}{T1+T2} \sim \text{relative position of tap node}$$

Thus, once the receiver IC 156 determines the first and second rise times (T1, T2), the receiver IC 156 can utilize these ratios associated with the rise times to determine a relative position for the tap node 216 for the variable resistor 210, and thereby determine the setting for the mechanical adjustment mechanism 110 for the mechanically adjusted circuit 162.

Figure 5B:
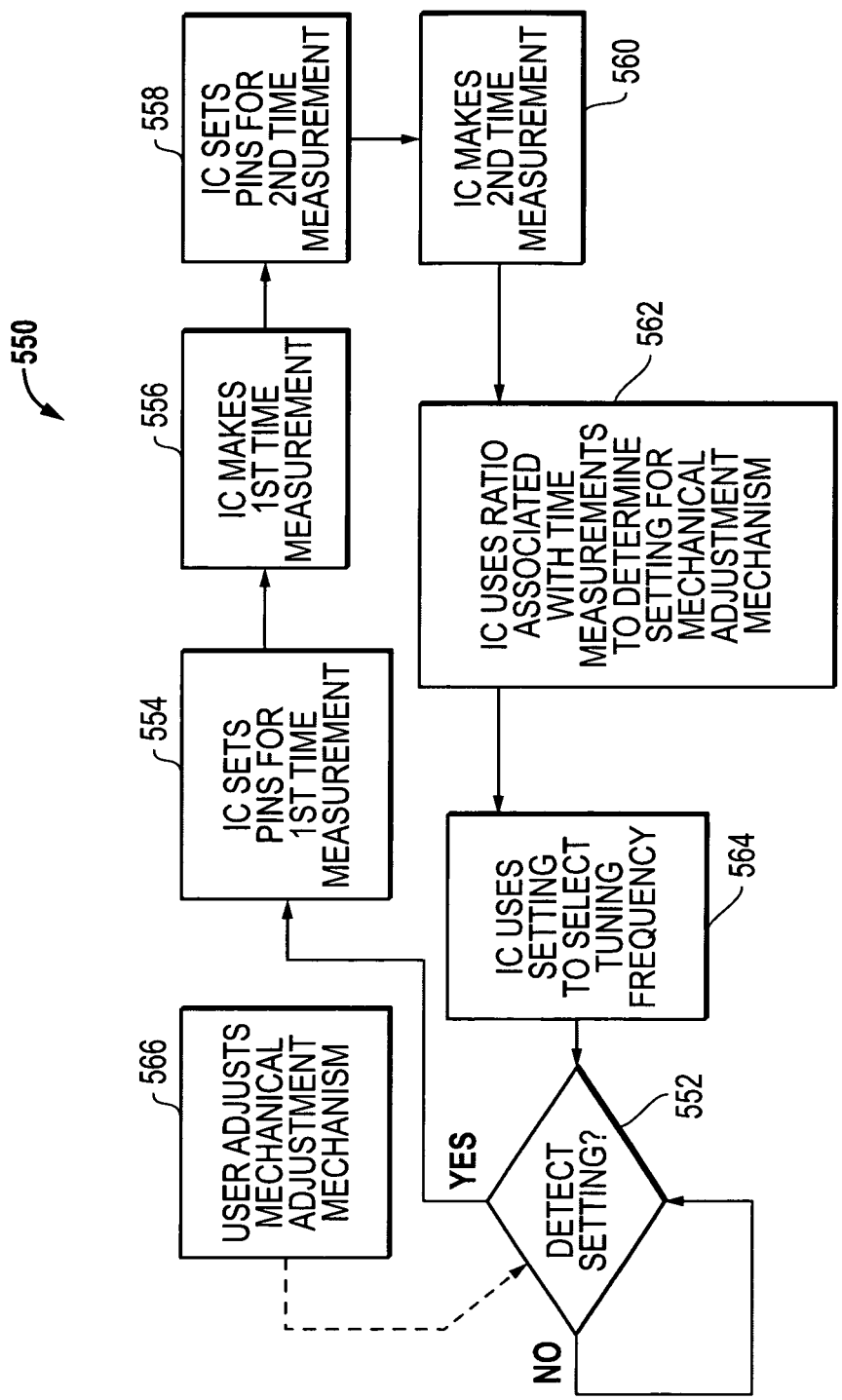
FIG. 5.B is a process diagram for determining a setting for the mechanical adjustment mechanism.

FIG. 5B provides a process diagram for an embodiment 550 for determining the setting for the mechanical adjustment mechanism 110. During operation of the mechanically tuned radio 100, the user may adjust the mechanical adjustment mechanism from time to time based upon the channel or frequency the user desires to tune. Block 556 represents this event where the user adjusts the mechanical adjustment mechanism. In determination block 552, a determination is made by the receiver IC 156 whether or not to detect the setting of the mechanical adjustment mechanism. As indicated above, the receiver IC 156 can be configured to automatically detect the setting at periodic intervals, or the receiver IC 156 could be configured to detect the setting based upon a control signal initiated by the user or another device. If the determination is "NO" in determination block 552, flow loops back to block 552. If the determination is "YES," then flow passes to block 554 where the receiver IC 156 sets the pins for the first time measurement. In block 556, the receiver IC 156 makes the first time measurement. In block 558, the receiver IC 156 then sets the pins for the second time measurement. In block 560, the receiver IC 156 makes the second time measurement. Next, in block 562, the receiver IC 156 uses a ratio associated with the time measurements, such as those set forth above, to determine the setting for the mechanical adjustment mechanism 110. Finally, in block 564, the receiver IC 156 uses the setting to select the tuning frequency for the mechanically tuned radio 100. Flow then proceeds back to determination block 552. Block 556 represents As described above, therefore, the receiver IC 156 can utilize the relative position of the tap node as a representation of the tuning changes made by the user. Thus, as the mechanical tuning mechanism is adjusted by the user, the receiver IC 156 can determine the relative changes and thereby the setting for the mechanical tuning mechanism. For the mechanically tuned radio 100, these relative changes and settings can be used to set the tuning frequency for the mechanically tuned radio 100. For example, with respect to the FM broadcast spectrum, it may be desirable to tune to frequencies from 87 MHz to 107 MHz in 0.1 MHz intervals, if channels are spaced by 100 kHz. As such, there are about 200 different frequencies or channels to tune. The relative position for the tap node 216 can move between $R_1=0$ ($R_2=$max) to $R_1=$max ($R_2=0$). This range also correlates to a range of values for $T_1$ and $T_2$. This range of time values can then be divided into 200 different segments and used to correlate the time ratios to a frequency to be tuned. Thus, as the user adjusts the mechanical adjustment mechanism 110, the mechanically adjusted circuit 162 is also changed. These changes are determined through the time measurements and related ratios. The ratios are used to determine the setting for the mechanical adjustment mechanism. And the tuning frequency is set based upon the determination of the setting. In this way, the mechanically tuned radio 100 is able to provide mechanical tuning without requiring an analog-to-digital converter to directly measure the changes to a mechanically adjusted circuit.

It is further noted that the ratiometric time measurements described herein can provide 8-bits or more of precision with respect to settings for the mechanical adjustment mechanism. Further, the ratiometric time measurements described herein can provide 6-bits or more of accuracy (approximately 2%) for the detection of the setting. These parameters are adequate, for example, for use with respect to a mechanically tuned radio. It is still further noted that while the above embodiments are described using two pins for the integrated circuit, other embodiments could use a different number of pins while still taking advantage of ratiometric time measurements.

Figure 6:
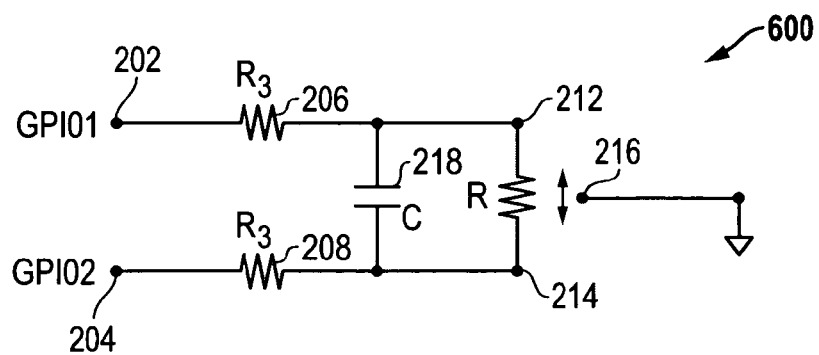
FIG. 6 is a circuit diagram for an alternative configuration for the mechanically adjusted circuit.

FIG. 6 is a circuit diagram for an alternate circuit configuration 600 for the mechanically adjusted circuit. In this embodiment, the capacitor 218 has been moved and coupled between the first terminal 212 and the second terminal 214 for the variable resistor 210. This configuration also works with a similar detection process. While the circuit in FIG. 6 still uses a ratiometric time measurement, the pin settings can be configured differently. For this circuit, one pin can be set to ground while the other is set first as a high voltage level output (pre-charge) and then as a high-impedance input. So, for this circuit configuration, the same pin is used to drive the voltage and then sense the rise time, rather than driving with one pin and sensing with the other. The end result is still a similar time measurement as described above.

Figure 7:
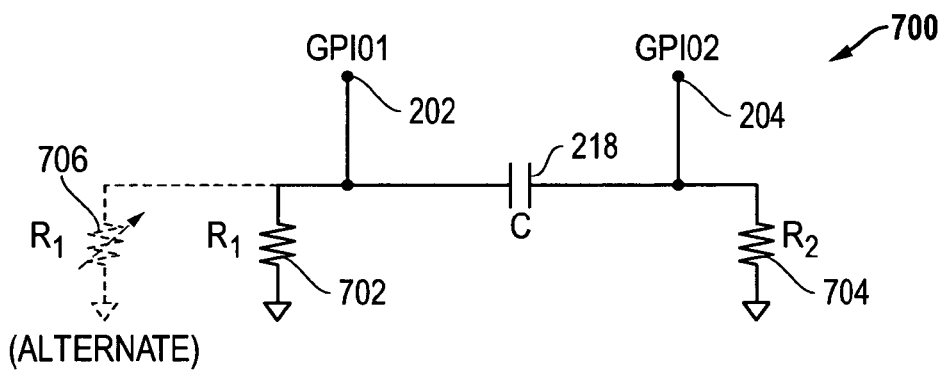
FIG. 7 is a circuit diagram for an alternative mechanically adjusted circuit including a fixed timing relationship or a variable timing relationship.

FIG. 7 is a circuit diagram for an alternate mechanically adjusted circuit including a fixed timing relationship or a variable timing relationship. In this embodiment 700, the capacitor (C) 218 is coupled between the first pin (GPIO1) 202 and the second pin (GPIO2) 204. A first fixed resistor (R1) 702 is coupled between the first pin (GPIO1) 202 and ground, and a second fixed resistor (R2) 704 is coupled between the second pin (GPIO2) 204 and ground. This configuration would work with the detection process above where one pin is set to a high impedance while the other is set to a high voltage level. However, by using fixed resistors, the timing relationships provided by the determination of T1 and T2 would provide a fixed setting. This configuration could be used, for example, where a fixed tuning frequency was desired to be selected for a device by selection of the values for the first resistor (R1) 702 and/or the second resistor (R2) 704.

With respect to FIG. 7, if a variable setting were desired for the configuration of FIG. 7, an alternate embodiment could be implemented with a variable resistor (R1) 706 being coupled between the first input pin (GPIO1) 202 and ground instead of, or in addition to, the fixed resistor (R1) 702.

It is further noted that the time measurements could be made using a fall time instead of a rise time, as described above. Other variations could also be made, as desired, while still relying upon ratios of time measurements to determine mechanical settings.

Figure 8:
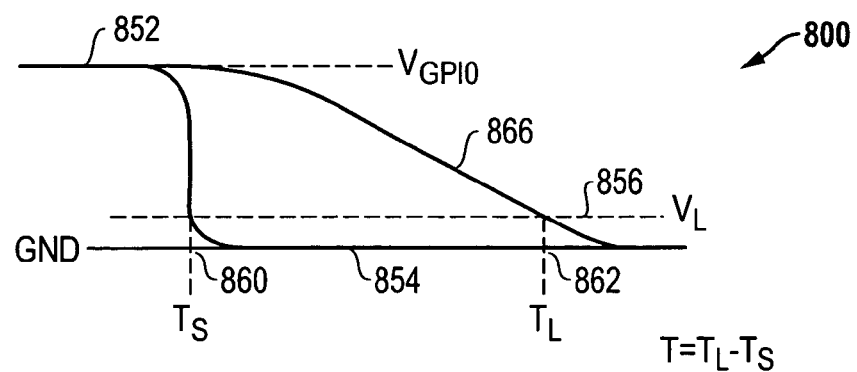
FIG. 8 is a signal diagram showing the detection of a signal fall time rather than a signal rise time for the timing measurements.

FIG. 8 is a signal diagram 800 showing the detection of a signal fall time rather than a signal rise time. Rather then raising one pin ground to a high voltage level as with FIGS. 4A-B and 5A-B, the embodiment of FIG. 8 places a pin to a high voltage level and then drops the pin to ground. As such, rather than detecting a rise time, the embodiment 800 detects a fall time. The circuit configuration can be the same as for FIGS. 4A, 4B and 6 above. Again, other circuit configurations could also be used, if desired.

In particular, for the time measurements, one pin is set to high impedance (Z), and the second pin is set to a high voltage level ($V_{GPIO}$) 852. This causes the voltage at the second high-Z pin to rise to this high voltage level ($V_{GPIO}$) 852. The first pin is then set to ground (GND) 854. This drop to ground causes the voltage on the tap node 216, as well as the voltage on the second pin, to drop and asymptotically approach ground. The fall of this voltage, as represented by line 866, will be dependent upon the value of the capacitor (C) 218 and the variable resistor (R1/R2) 210A/B. The receiver IC 156 detects an end time ($T_L$) 862 at which the voltage fall 866 passes a threshold voltage ($V_L$) 856. The receiver IC 156 then compares this end time ($T_L$) 862 to the start time ($T_S$) 860 when the voltage on the first pin (GPIO) was set to ground (GND) 854. The comparison provides a fall time ($T=T_L-T_S$) that is related to the value of the variable resistor (R1/R2) 210A/B. Similar to above, by doing this detection process for both pins, a first fall time (T1) can be determined for the first variable resistor (R1) 210A, and a second fall time (T2) can be determined for the second variable resistor (R2) 210B. As with the equations above, the ratio of these fall times with respect to their total can again be used to determine the setting for mechanical adjustment mechanism, as above.

It is noted that the receiver IC 156 can be configured to use a Schmidt trigger circuit to detect when the voltage falls below the threshold voltage ($V_L$) 856. The Schmidt trigger circuit can be biased to switch states when the voltage falls below the threshold voltage ($V_L$) 856. This change in states can be used by the receiver IC 156 to determine the fall times. It is further noted that the threshold voltage ($V_L$) 856 can be selected to be about 35% of the voltage ($V_{GPIO}$) 852 placed on the pin, if desired.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A mechanically tuned radio, comprising:
a mechanically adjusted circuit being controlled by a manual adjustment mechanism, the mechanically adjusted circuit comprising:
   a variable resistor having first and second terminals and a variable tap node, the variable tap node being controlled by the mechanical adjustment mechanism; and
   a capacitor coupled to the variable resistor;
audio output circuitry;
power supply circuitry;
an antenna, and
a receiver integrated circuit coupled to receive a voltage supply from the power supply circuitry, coupled to receive a signal from the antenna, coupled to the mechanically adjusted circuit, and coupled to provide audio signals to the audio output circuitry;
wherein the receiver integrated circuit is configured to determine a setting for the mechanical adjustment mechanism through time measurements of the mechanically adjusted circuit, and is further configured to use the setting to select a tuning frequency for the mechanically tuned radio;
wherein a first terminal of the variable resistor is coupled to a first pin for the receiver integrated circuit and second terminal of the variable resistor is coupled to a second pin for the receiver integrated circuit;
wherein the time measurements comprise a first time measurement associated with a first portion of the variable resistor between the first terminal and the variable tap node and a second time measurement associated with a second portion of the variable resistor between the second terminal and the variable tap node;
wherein for the first time measurement, the receiver integrated circuit is further configured to use the first pin to apply a voltage to the first portion of the variable resistor and to use the second pin to detect a voltage change on the variable tap node;
wherein for the second time measurement, the receiver integrated circuit is further configured to use the second pin to apply a voltage to the second portion of the variable resistor and to use the first pin to detect a voltage change on the variable tap node; and
wherein a ratio associated with the first and second time measurements is used to determine the setting.

2. The mechanically tuned radio of claim 1, wherein the first and second pins are programmable among a plurality of operational modes including a high impedance mode.

3. The mechanically tuned radio of claim 1, wherein the variable tap node is coupled to ground.

4. The mechanically tuned radio of claim 1, wherein the first and second time measurements comprise rise time measurements detected at the first and second pins.

5. The mechanically tuned radio of claim 1, wherein the first and second time measurements comprise fall time measurements detected at the first and second pins.

6. The mechanically tuned radio of claim 1, wherein a ratio of the first time measurement to a total of the first time measurement and the second time measurement is used to determine the setting.

7. The mechanically tuned radio of claim 1, wherein a ratio of the second time measurement to a total of the first time measurement and the second time measurement is used to determine the setting.

8. The mechanically tuned radio of claim 1, wherein the capacitor is coupled between the variable tap node and ground.

9. The mechanically tuned radio of claim 1, wherein the capacitor is coupled between the two terminals of the variable resistor.

10. A method for mechanically tuning a radio, comprising:
providing a mechanically adjusted circuit controlled by a mechanical adjustment mechanism, the mechanically adjusted circuit comprising:
   a variable resistor having first and second terminals and a variable tap node, the variable tap node being controlled by the mechanical adjustment mechanism; and
   a capacitor coupled to a variable resistor;
providing a receiver integrated circuit having a first pin coupled to the first terminal of the variable resistor and a second pin coupled to the second terminal of the variable resistor;
making a first time measurement associated with a first portion of the variable resistor between the first terminal and the variable tap node using the first pin to apply a voltage to the first portion of the variable resistor and the second pin to detect a voltage change on the variable tap node;
making a second time measurement associated with a second portion of the variable resistor between the second terminal and the variable tap node using the second pin to apply a voltage to the second portion of the variable resistor and the first pin to detect a voltage change on the variable tap node;
determining a setting for the mechanical adjustment mechanism based upon a ratio associated with the first and second time measurements;
receiving signals from an antenna using the receiver integrated circuit; and
utilizing the setting to select a tuning frequency for the received signals.

11. The method of claim 10, wherein the step of making a first time measurement comprises detecting a voltage rise time associated with the first portion of the variable resistor, and wherein the step of making the second time measurement comprises detecting a second voltage rise time associated with the second portion of the variable resistor.

12. The method of claim 10, wherein the variable tap node is coupled to ground.

13. The method of claim 10, wherein the step of making a first time measurement comprises detecting a voltage fall time associated with the first portion of the variable resistor, and wherein the step of making a second time measurement comprises detecting a second voltage fall time associated with the second portion of the variable resistor.

14. The method of claim 10, wherein the determining step utilizes a ratio of at least one of the first time measurement or the second time measurement to a total of the first time measurement and the second time measurement to determine the setting.

15. The method of claim 10, wherein the capacitor is coupled between the variable tap node and ground.

16. The method of claim 10, wherein the variable tap node is coupled to ground.

17. The method of claim 10, wherein the capacitor is coupled between the two terminals of the variable resistor.

18. A device having a mechanically adjusted operational feature, comprising:
an integrated circuit within a device having at least two programmable pins;
a mechanically adjusted circuit coupled to the two programmable pins, the mechanically adjusted circuit being controlled by a mechanical adjustment mechanism, and the mechanically adjusted circuit comprising:
a variable resistor having first terminal coupled to the first programmable pin, a second terminal coupled to the second programmable pin, and a variable tap node, wherein the variable tap node is controlled by the mechanical adjustment mechanism; and
a capacitor coupled to the variable resistor; and
control circuitry within the integrated circuit configured to make a first time measurement associated with a first portion of the variable resistor between the first terminal and the variable tap node to make a second time measurement associated with a second portion of the variable resistor between the second terminal and the variable tap node, and to determine a setting for the mechanical adjustment mechanism based upon a ratio associated with the first and second time measurements;
wherein for the first time measurement, the control circuitry is further configured to use the first pin to apply a voltage to the first portion of the variable resistor and to use the second pin to detect a voltage change on the variable tap node;
wherein for the second time measurement, the control circuitry is further configured to use the second pin to apply a voltage to the second portion of the variable resistor and to use the first pin to detect a voltage change on the variable tap node; and
wherein the integrated circuit is further configured to utilize the setting to at least in part control an operational feature for the device.

19. The device of claim 18, wherein the first and second pins are programmable among a plurality of operational modes including a high impedance mode.

20. The device of claim 18, wherein the variable tap node is coupled to ground.

21. The device of claim 18, wherein the first and second time measurements comprise rise time measurements or fall time measurements detected at the first and second pins.

22. The device of claim 18, wherein the receiver integrated circuit is configured to utilize a ratio of at least one of the first time measurement or the second time measurement to a total of the first time measurement and the second time measurement to determine the setting.

23. The device of claim 18, wherein the capacitor is coupled between the variable tap node and ground.

24. The device of claim 18, wherein the capacitor is coupled between the two terminals of the variable resistor.

25. A method for determining a setting of a mechanical adjustment mechanism to at least in part control an operational feature of a device, comprising:
providing a mechanically adjusted circuit controlled by a mechanical adjustment mechanism, the mechanically adjusted circuit comprising:
a variable resistor having first and second terminals and a variable tap node, the variable tap node being coupled to ground and being controlled by the mechanical adjustment mechanism; and
a capacitor coupled to a variable resistor;
providing a receiver integrated circuit having a first pin coupled to the first terminal of the variable resistor and a second pin coupled to the second terminal of the variable resistor;
making a first time measurement associated with a first portion of the variable resistor between the first terminal and the variable tap node using the first pin to apply a voltage to the first portion of the variable resistor and the second pin to detect a voltage change on the variable tap node;
making a second time measurement associated with a second portion of the variable resistor between the second terminal and the variable tap node using the second pin to apply a voltage to the second portion of the variable resistor and the first pin to detect a voltage change on the variable tap node;
determining a setting for the mechanical adjustment mechanism based upon a ratio associated with the first and second time measurements; and
utilizing the setting to at least in part control an operational feature of a device.

26. The method of claim 25, wherein the step of making a first time measurement comprises detecting a voltage rise time associated with the first portion of the variable resistor, and wherein the step of making a second time measurement comprises detecting a second voltage rise time associated with the second portion of the variable resistor.

27. The method of claim 25, wherein the step of making a first time measurement comprises detecting a voltage fall time associated with the first portion of the variable resistor, and wherein the step of making a second time measurement comprises detecting the second voltage fall time associated with a second portion of the variable resistor.

28. The method of claim 25, wherein the determining step utilizes a ratio of at least one of the first time measurement or the second time measurement to a total of the first time measurement and the second time measurement to determine the setting.

29. The method of claim 25, wherein the capacitor is coupled between the variable tap node and ground.

30. The method of claim 25, wherein the variable tap node is coupled to ground.

31. The method of claim 25, wherein the capacitor is coupled between the two terminals of the variable resistor.

* * * * *